(12) United States Patent
Takahira et al.

(10) Patent No.: US 12,477,653 B2
(45) Date of Patent: Nov. 18, 2025

(54) HIGH-FREQUENCY SIGNAL TRANSMISSION DEVICE AND HIGH-FREQUENCY SIGNAL TRANSMISSION CABLE

(71) Applicant: Yamaichi Electronics Co., Ltd., Tokyo (JP)

(72) Inventors: Hiroshi Takahira, Tokyo (JP); Akira Yonezawa, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 143 days.

(21) Appl. No.: 18/286,307

(22) PCT Filed: Apr. 19, 2021

(86) PCT No.: PCT/JP2021/015932
§ 371 (c)(1),
(2) Date: Oct. 10, 2023

(87) PCT Pub. No.: WO2022/224323
PCT Pub. Date: Oct. 27, 2022

(65) Prior Publication Data
US 2024/0172360 A1 May 23, 2024

(51) Int. Cl.
*H05K 1/02* (2006.01)
*H01B 7/08* (2006.01)
(Continued)

(52) U.S. Cl.
CPC ............ *H05K 1/112* (2013.01); *H01B 7/08* (2013.01)

(58) Field of Classification Search
CPC ...... H05K 1/0227; H05K 1/117; H05K 1/118; H05K 1/0219; H05K 1/0245; H01B 7/08
See application file for complete search history.

(56) References Cited

U.S. PATENT DOCUMENTS 7,154,353 B2 * 12/2006 Dohata ............... H05K 1/0219
333/1
9,306,334 B2 4/2016 Zhu et al.
(Continued)

FOREIGN PATENT DOCUMENTS

JP 2003-224408 A 8/2003
JP 2006-351274 A 12/2006
(Continued)

OTHER PUBLICATIONS

Extended European Search Report of EP patent application No. 21937821.3 issued on Mar. 18, 2025.

*Primary Examiner* — Timothy J Thompson
*Assistant Examiner* — Amol H Patel
(74) *Attorney, Agent, or Firm* — Procopio, Cory, Hargreaves & Savitch LLP

(57) ABSTRACT

High-frequency signal transmission cable includes: a dielectric layer; and first and second wiring layers arranged to sandwich the dielectric layer. The first wiring layer includes at least M (M indicating a natural number of 2 or more) differential transmission lines. The first wiring layer further includes a group of first ground lines including at least 2×M first ground lines. The second wiring layer includes a group of second ground lines including at least M second ground lines. The group of first ground lines are allocated to the M differential transmission lines in accordance with a condition of at least two first ground lines per one differential transmission line in non-overlap manner, and the group of second ground lines are allocated to the M differential transmission lines in accordance with a condition of at least one second ground line per one differential transmission line in non-overlap manner. Each of the differential transmission lines is interposed between the at least two first ground lines and is opposed to the at least one second ground line.

20 Claims, 15 Drawing Sheets

(51) Int. Cl.
  *H01R 12/57*   (2011.01)
  *H01R 12/77*   (2011.01)
  *H01R 12/79*   (2011.01)
  *H05K 1/11*    (2006.01)

(56) References Cited

U.S. PATENT DOCUMENTS

| | | | |
|---|---|---|---|
| 2002/0157865 A1* | 10/2002 | Noda | H05K 1/0224 |
| | | | 174/261 |
| 2006/0279371 A1* | 12/2006 | Sato | H05K 1/0219 |
| | | | 333/260 |
| 2007/0040626 A1* | 2/2007 | Blair | H05K 1/147 |
| | | | 333/1 |
| 2011/0253424 A1* | 10/2011 | Lai | H05K 1/0253 |
| | | | 174/254 |
| 2014/0051288 A1 | 2/2014 | Smink et al. | |
| 2017/0048968 A1 | 2/2017 | Komatsu | |
| 2024/0121886 A1* | 4/2024 | Muto | H01P 3/088 |

FOREIGN PATENT DOCUMENTS

| | | |
|---|---|---|
| JP | 2007-234500 A | 9/2007 |
| JP | 2016-092561 A | 5/2016 |
| JP | 6443158 B2 | 12/2018 |
| JP | 2019-071200 A | 5/2019 |
| WO | 2015/178313 A1 | 11/2015 |

* cited by examiner

[Fig. 1]
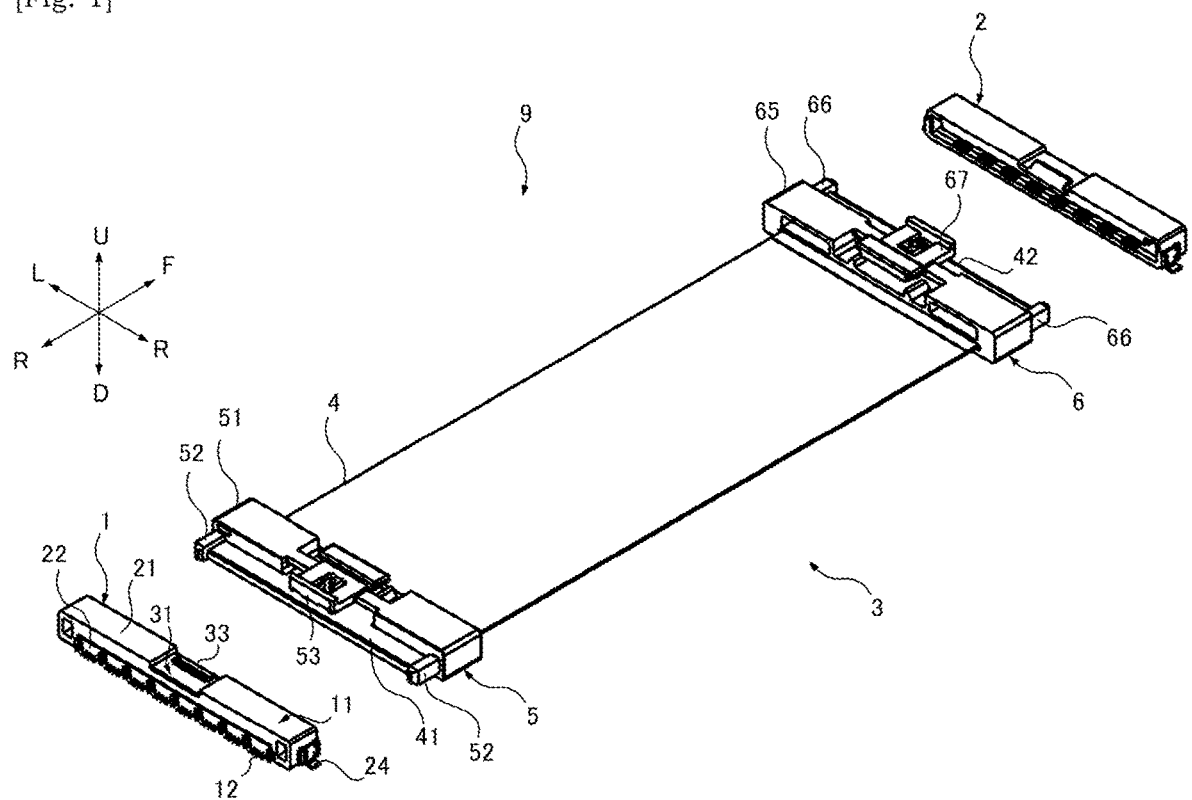
[Fig. 2]
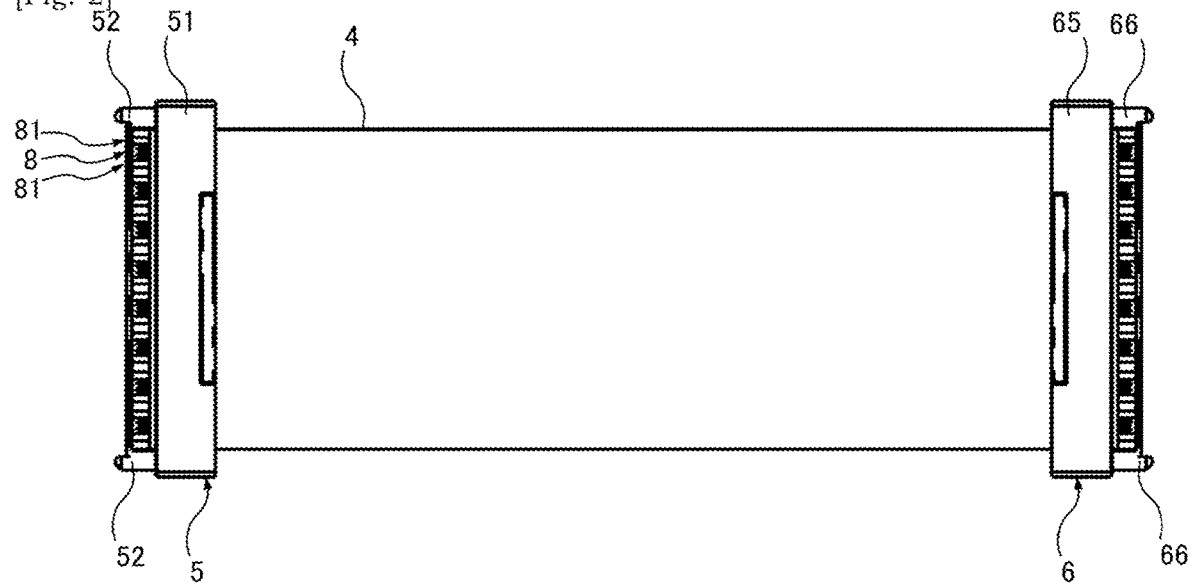

[Fig. 3]
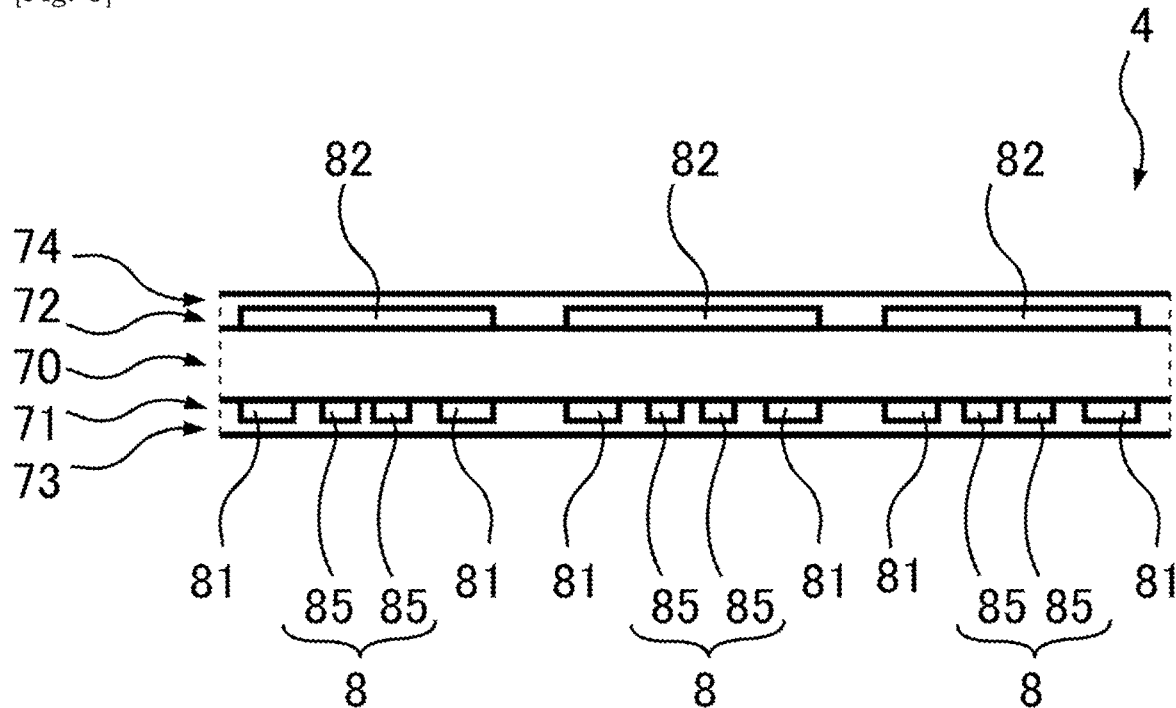
[Fig. 4]
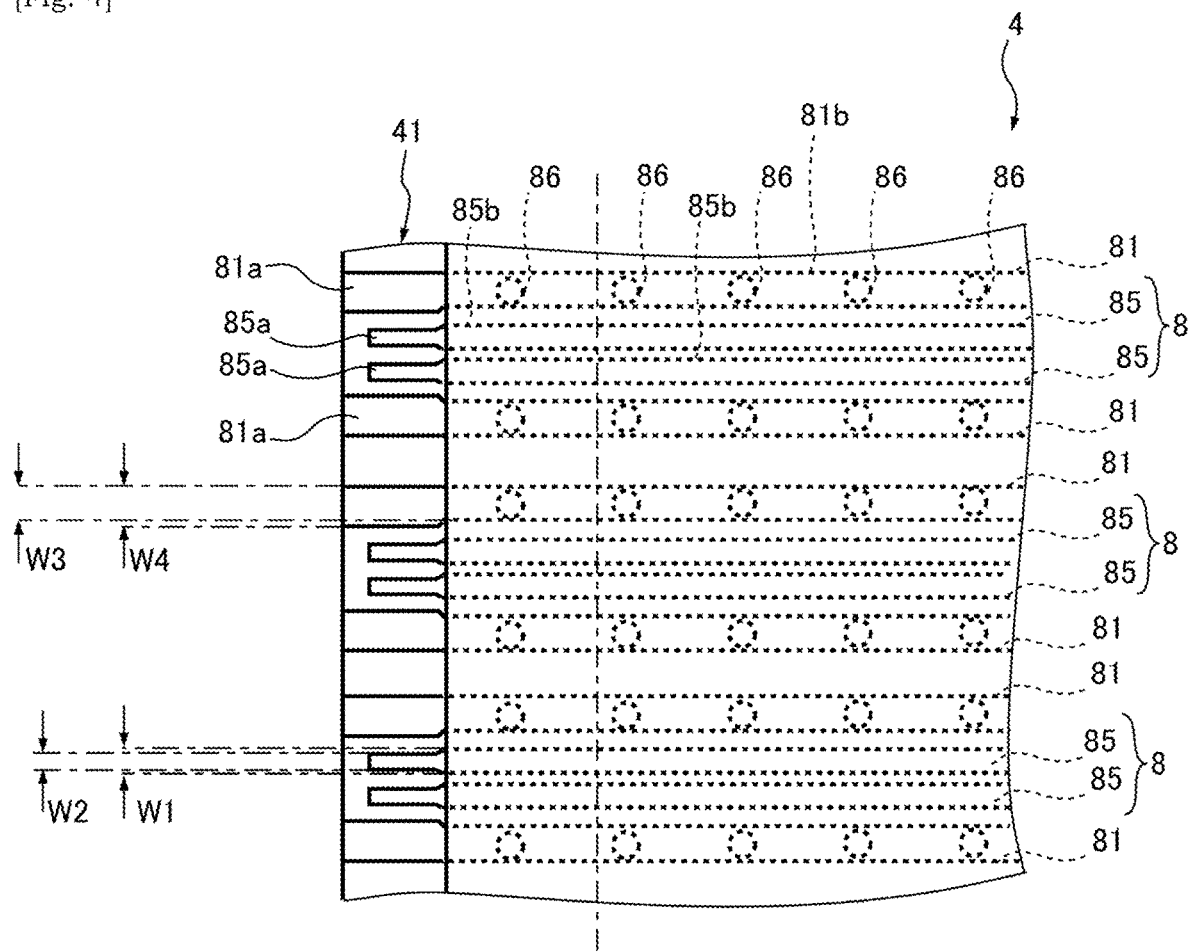

[Fig. 5]
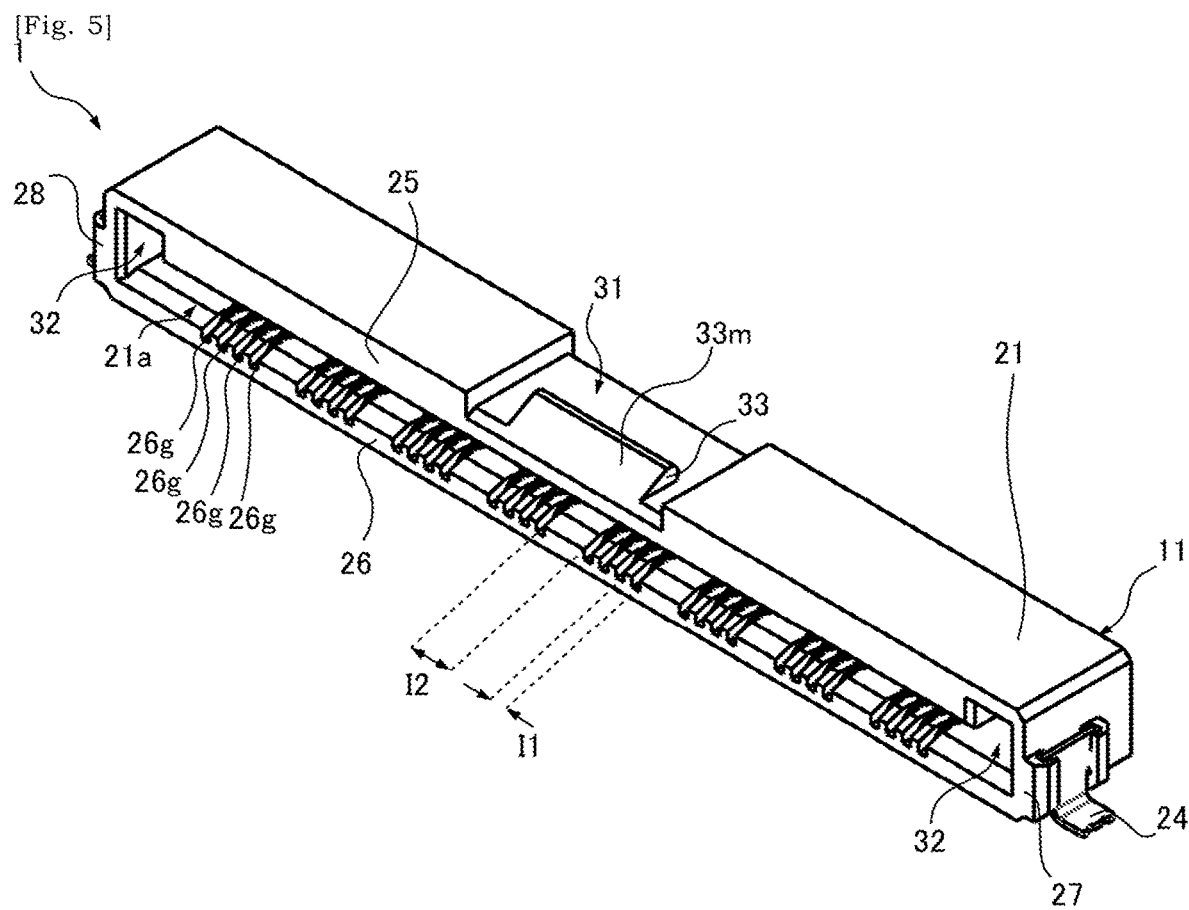

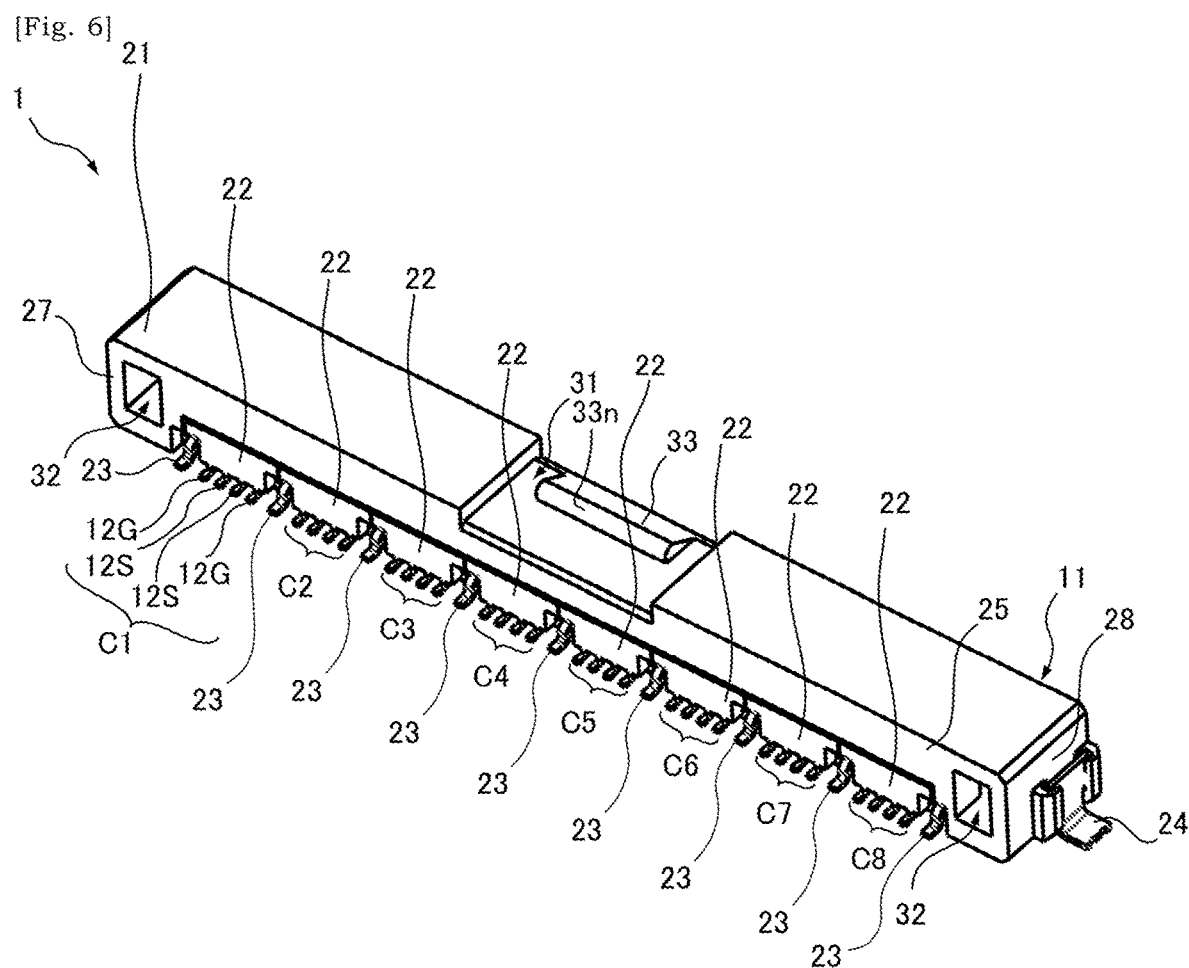
[Fig. 6]

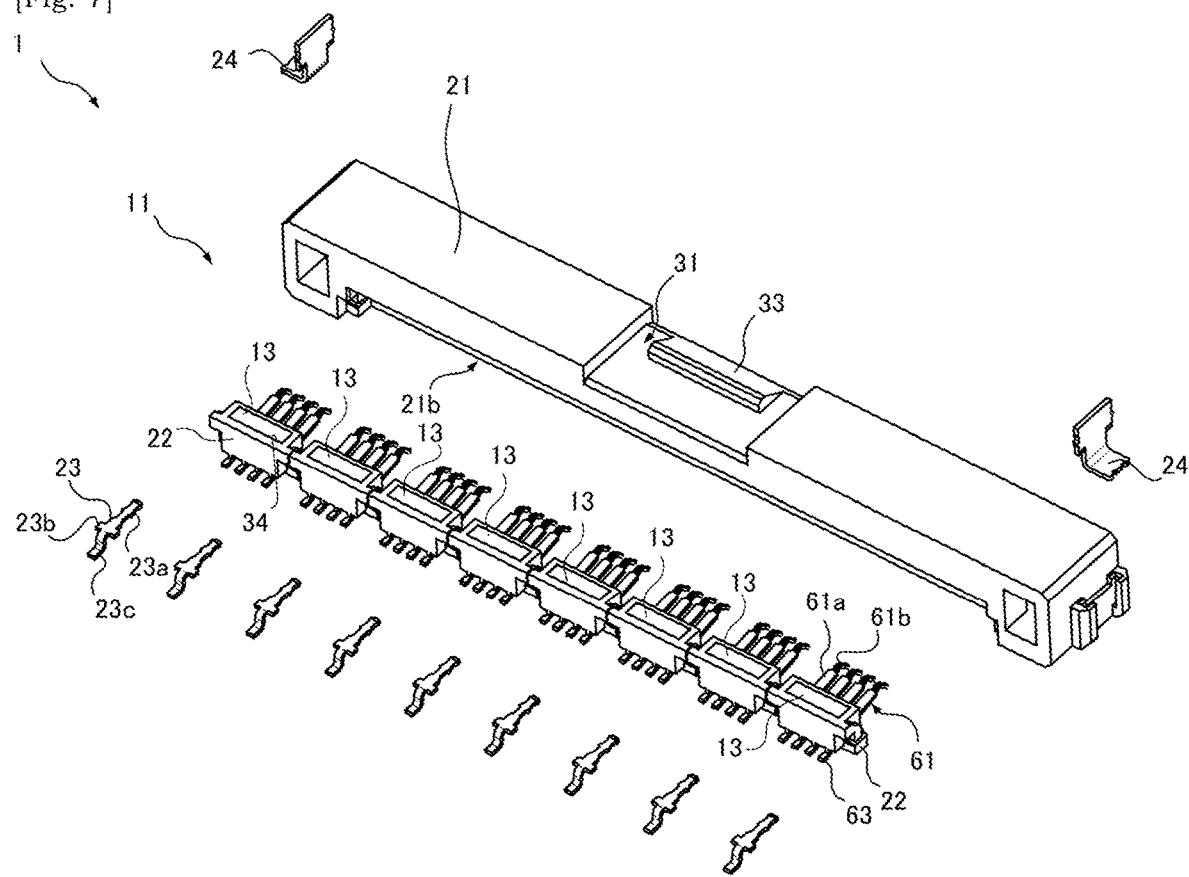
[Fig. 7]

[Fig. 8]
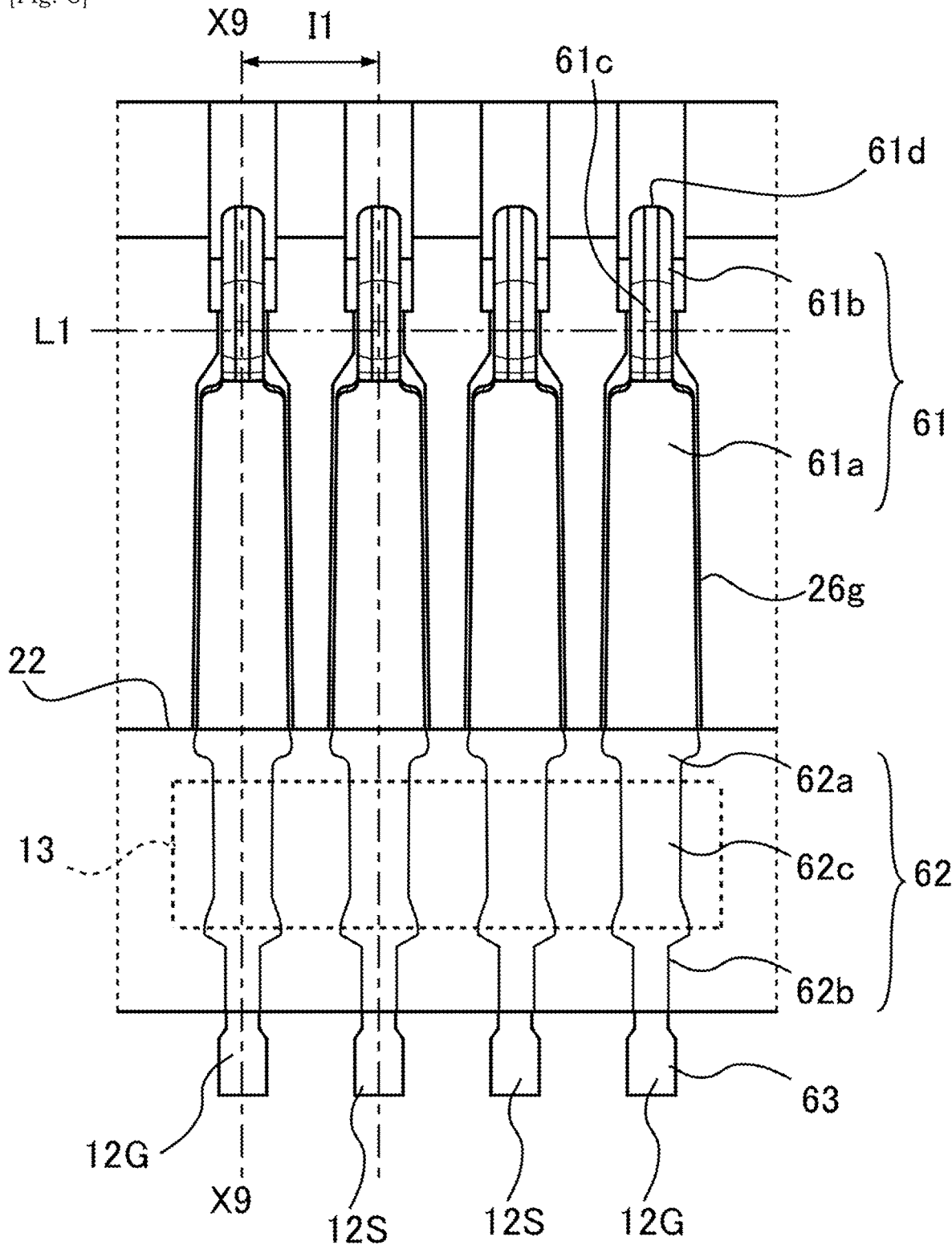

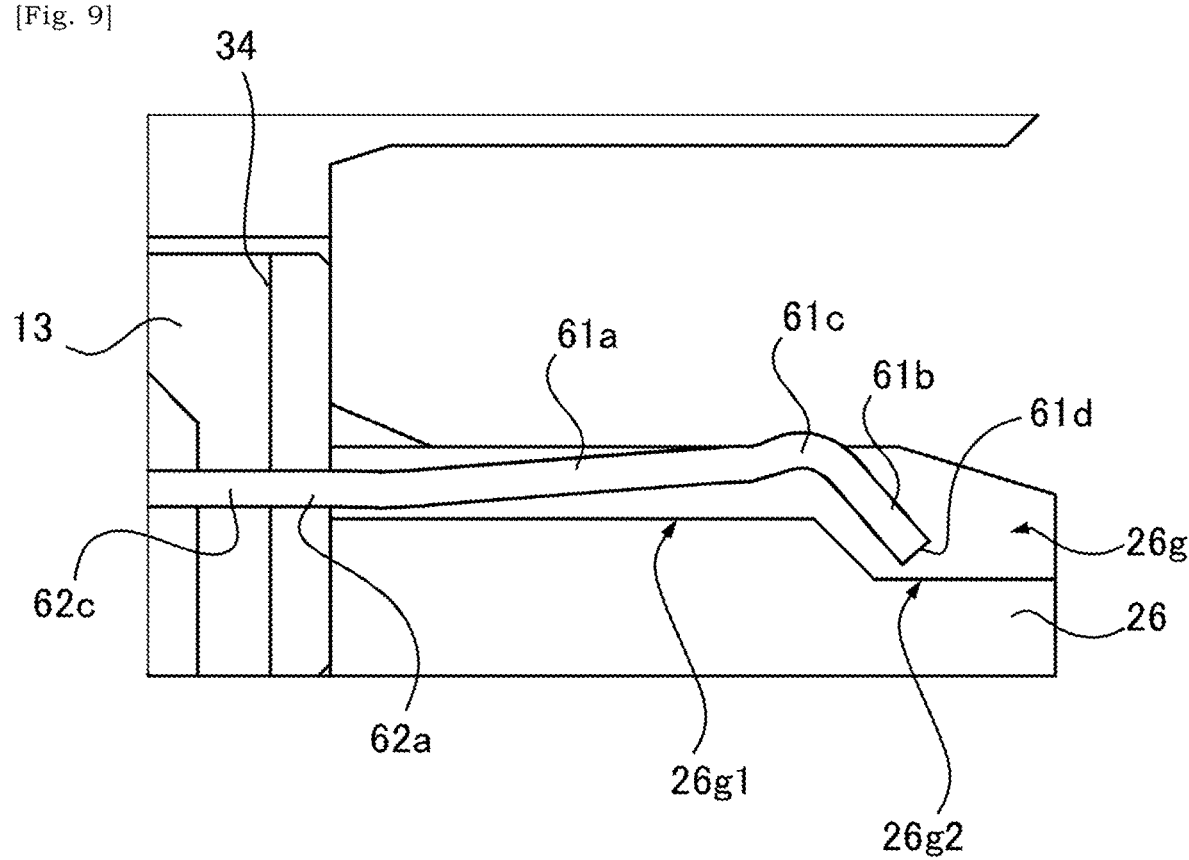
[Fig. 9]

[Fig. 10]
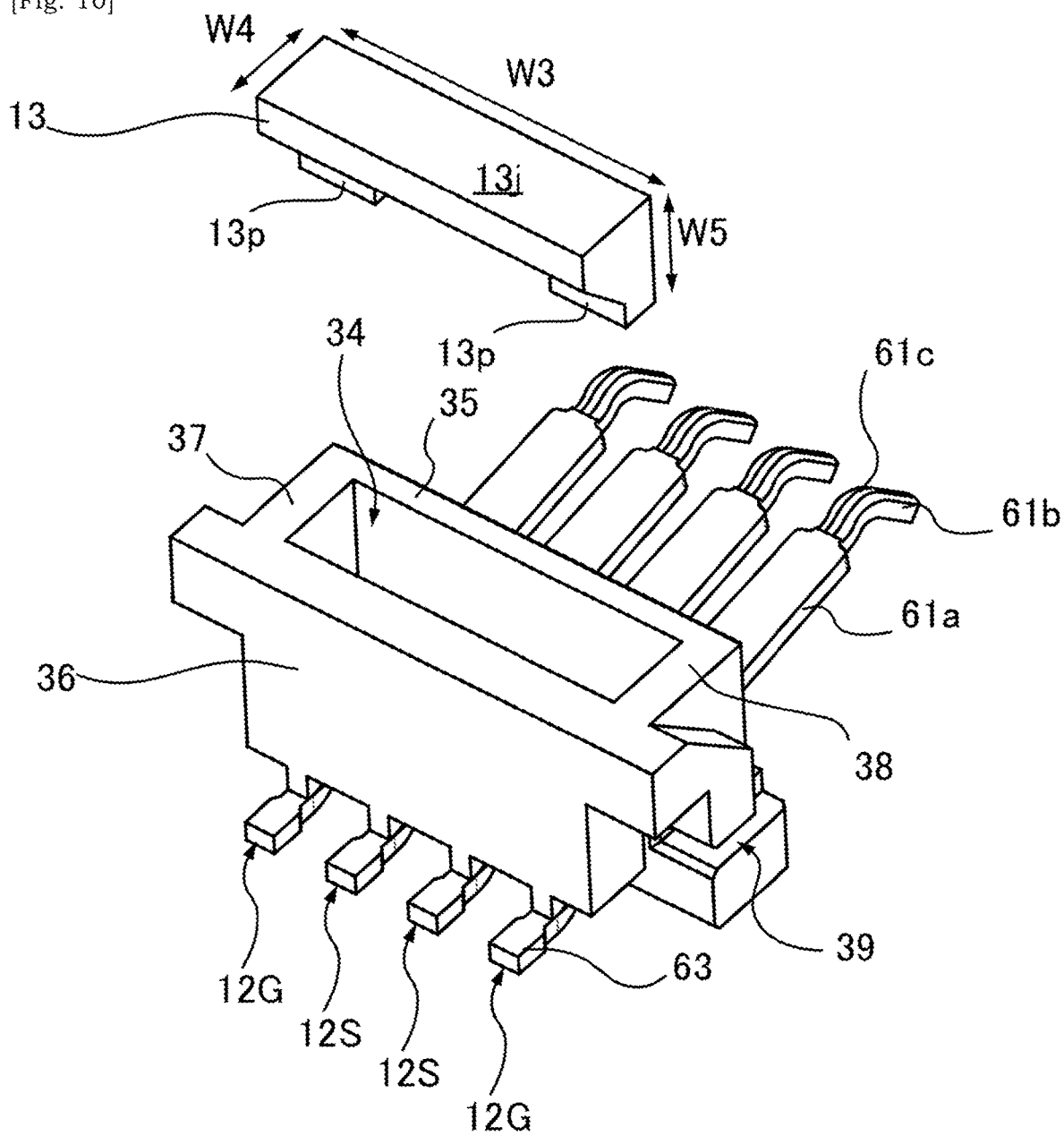

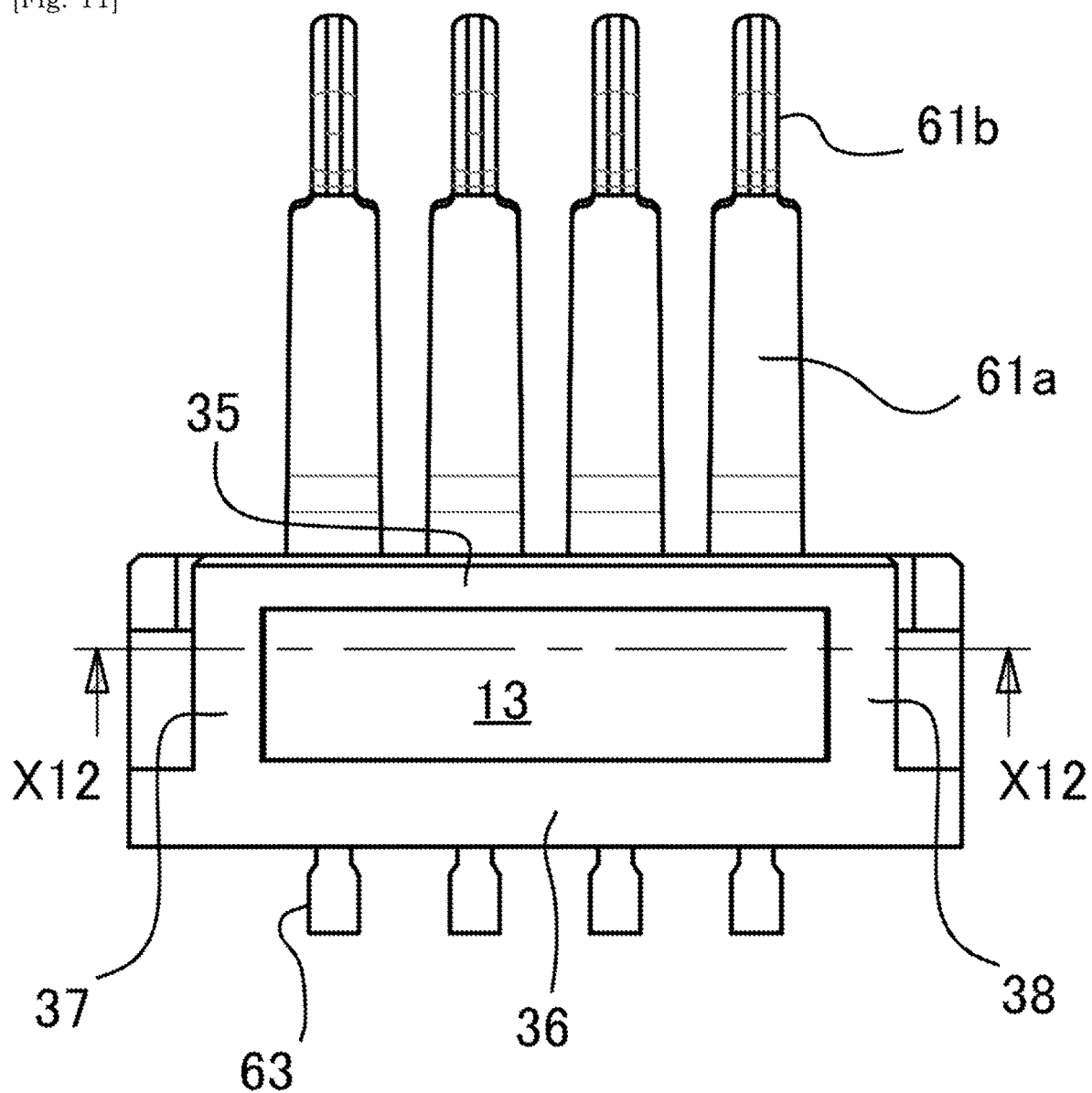
[Fig. 11]

[Fig. 12]
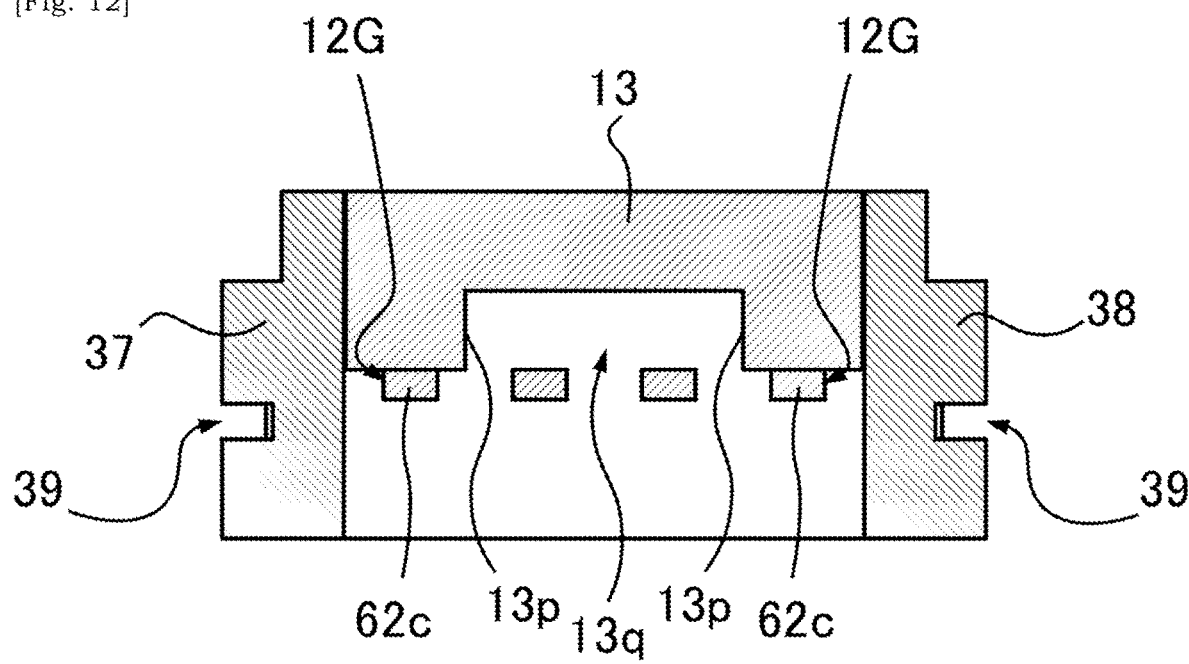
[Fig. 13]
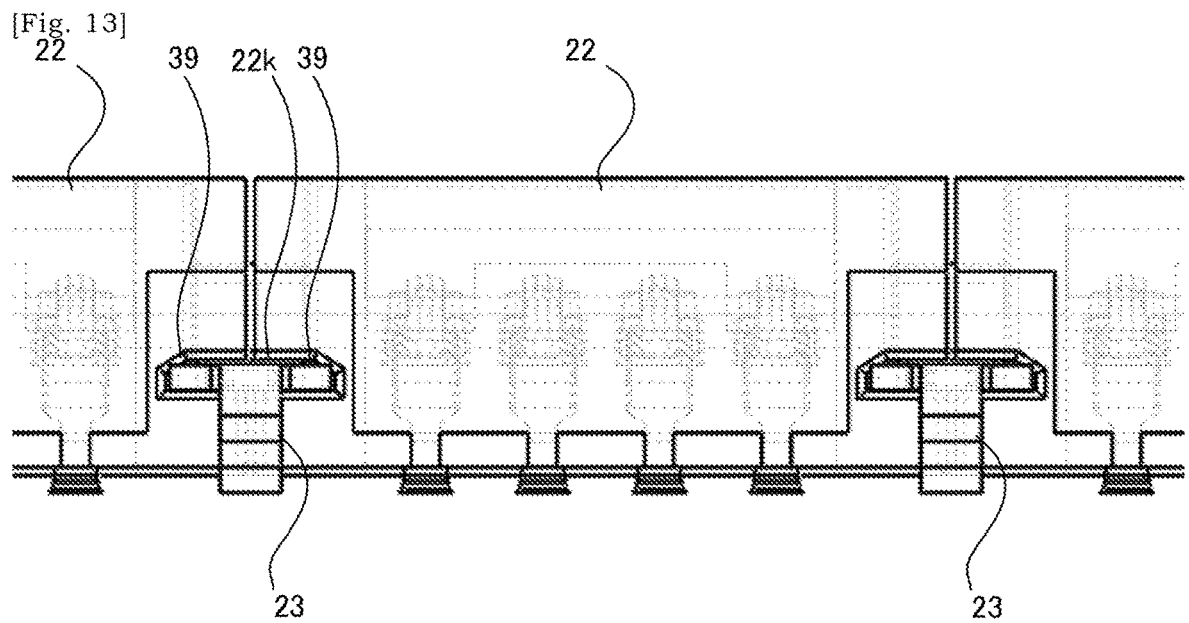

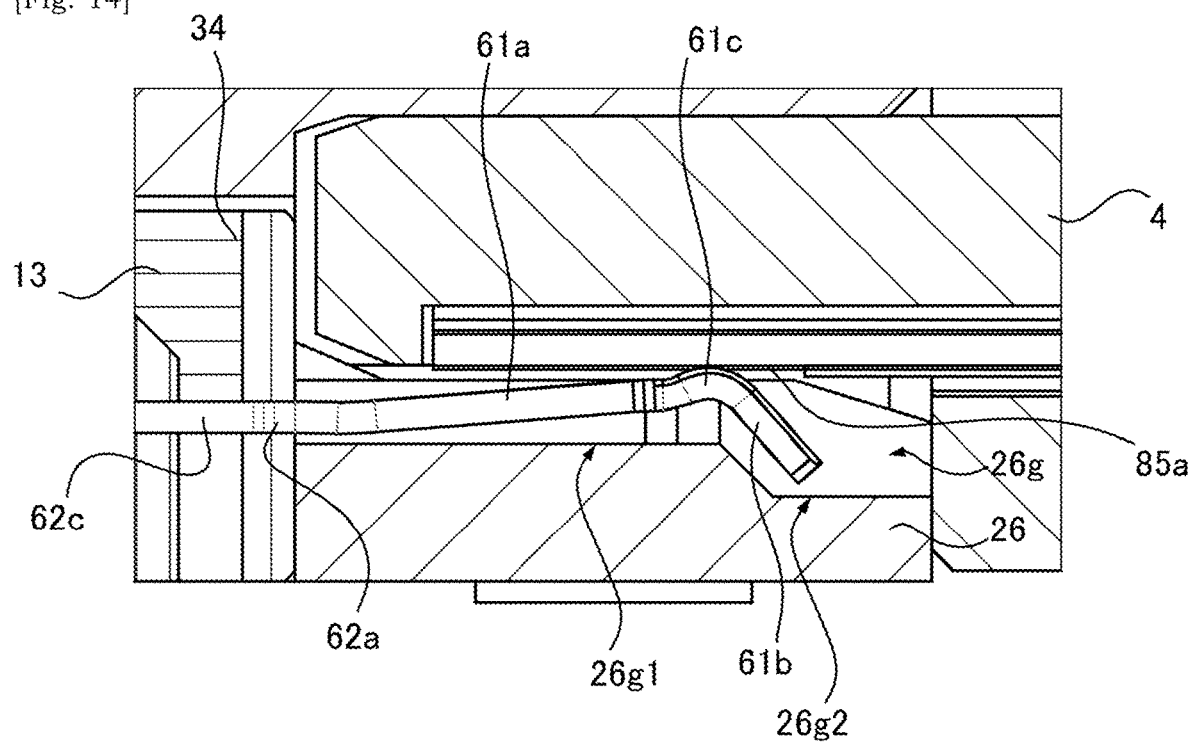
[Fig. 14]

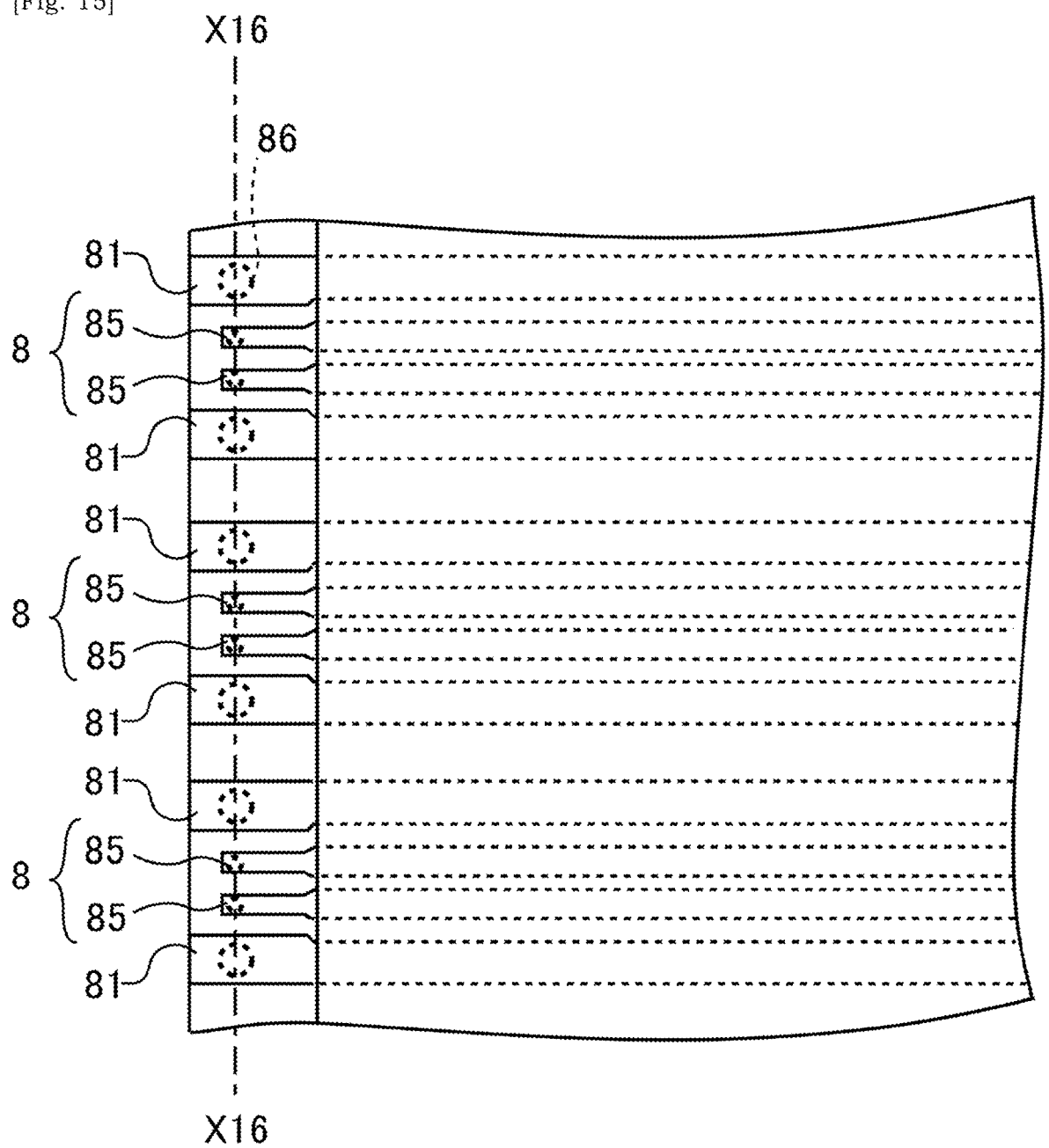
[Fig. 15]

[Fig. 16]
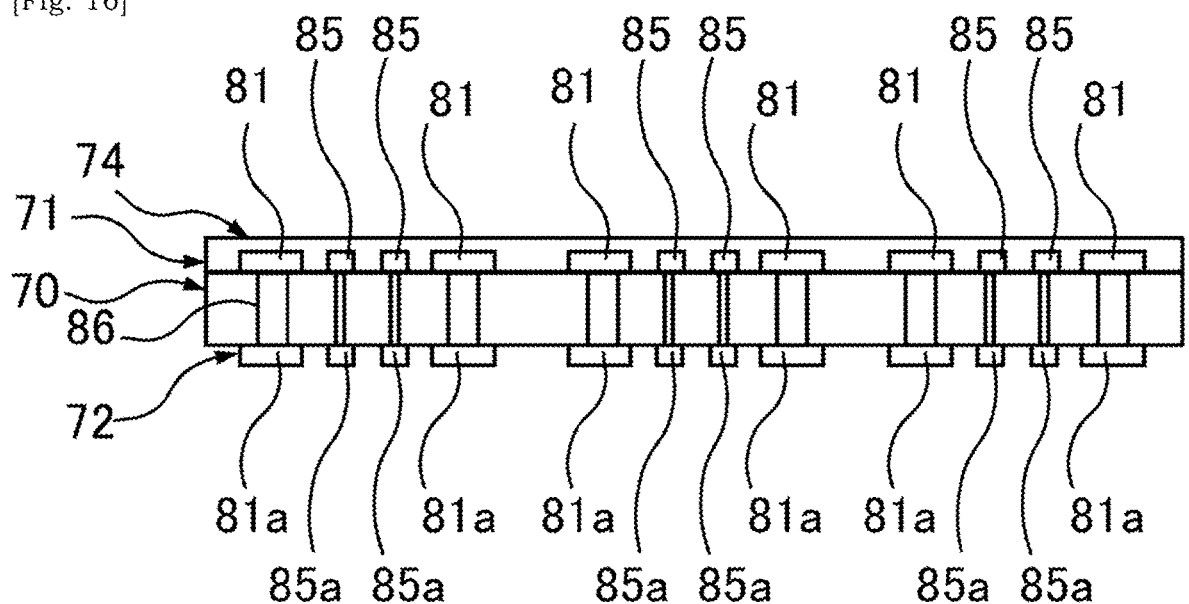
[Fig. 17]
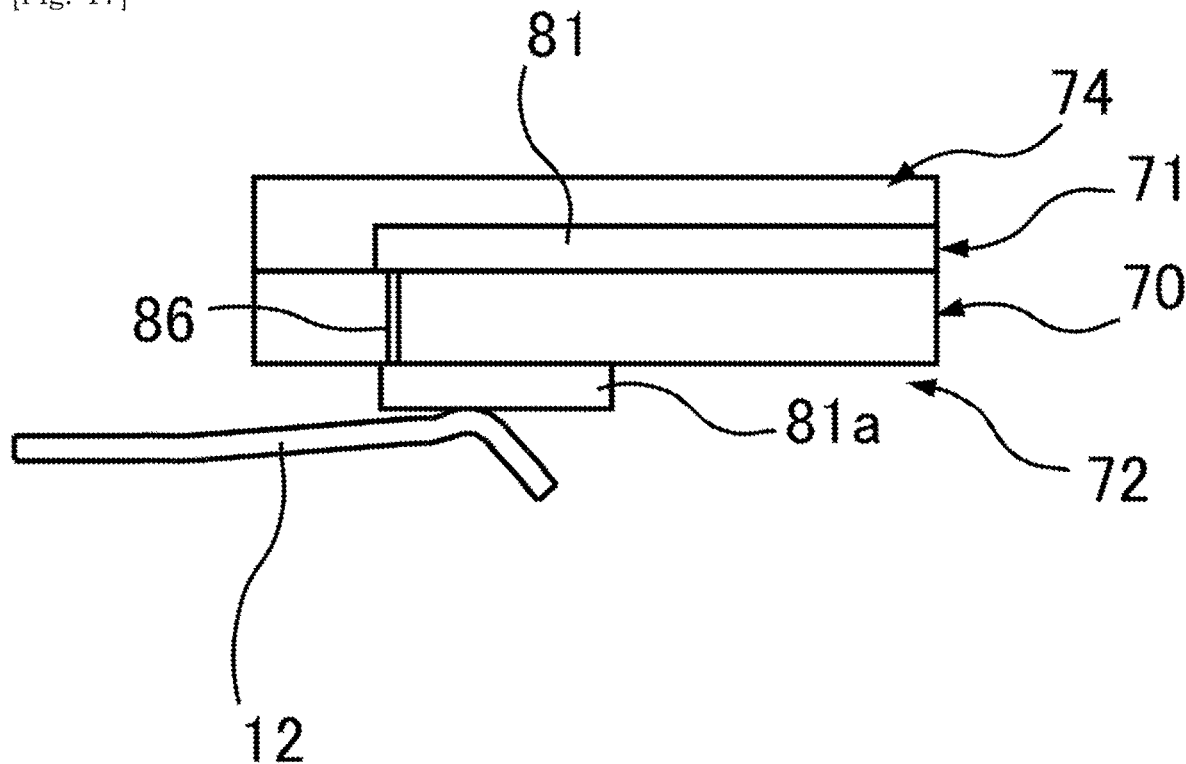

[Fig. 18]
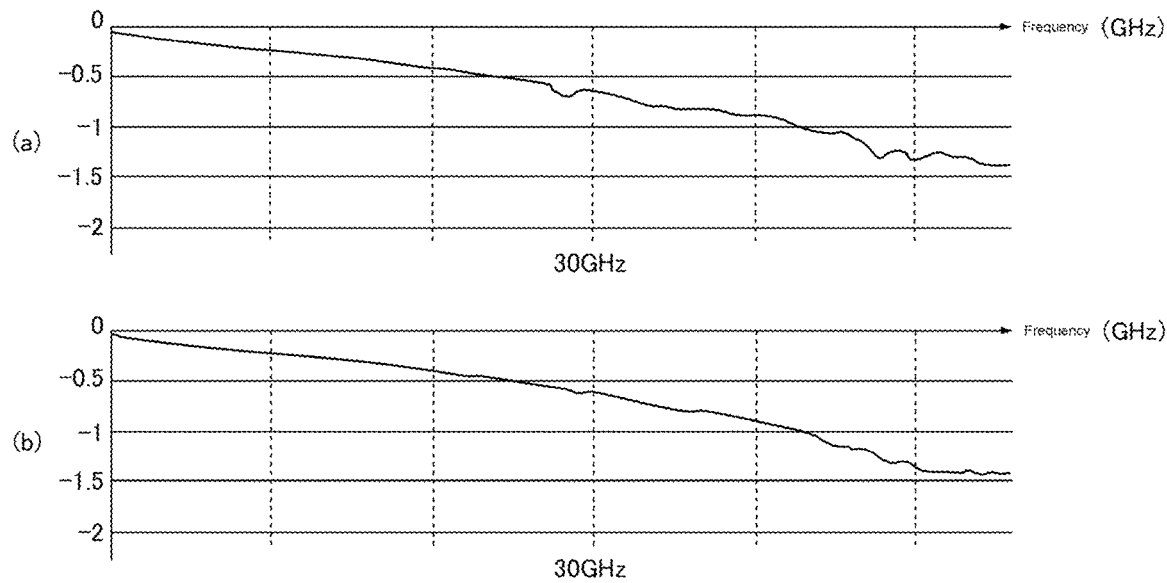
[Fig. 19]
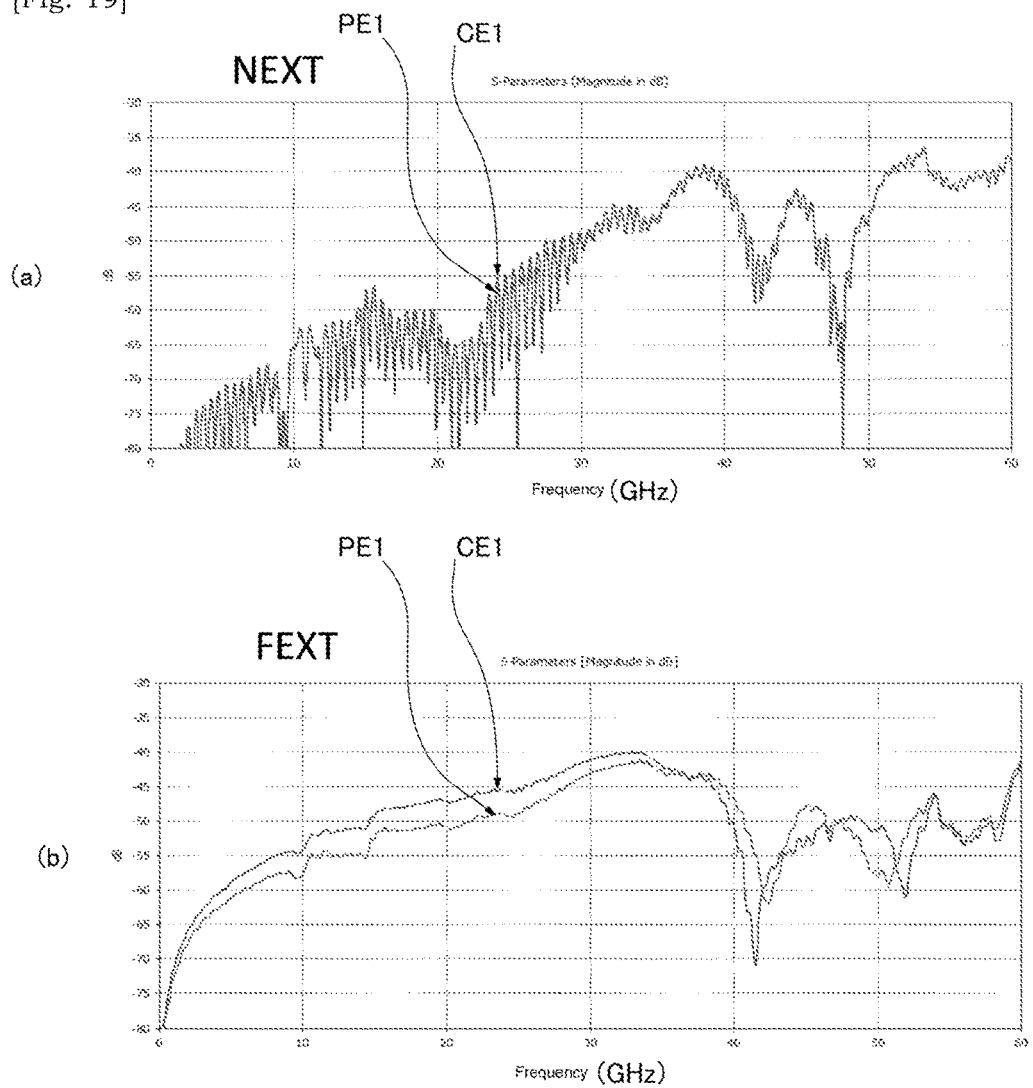

[Fig. 20]
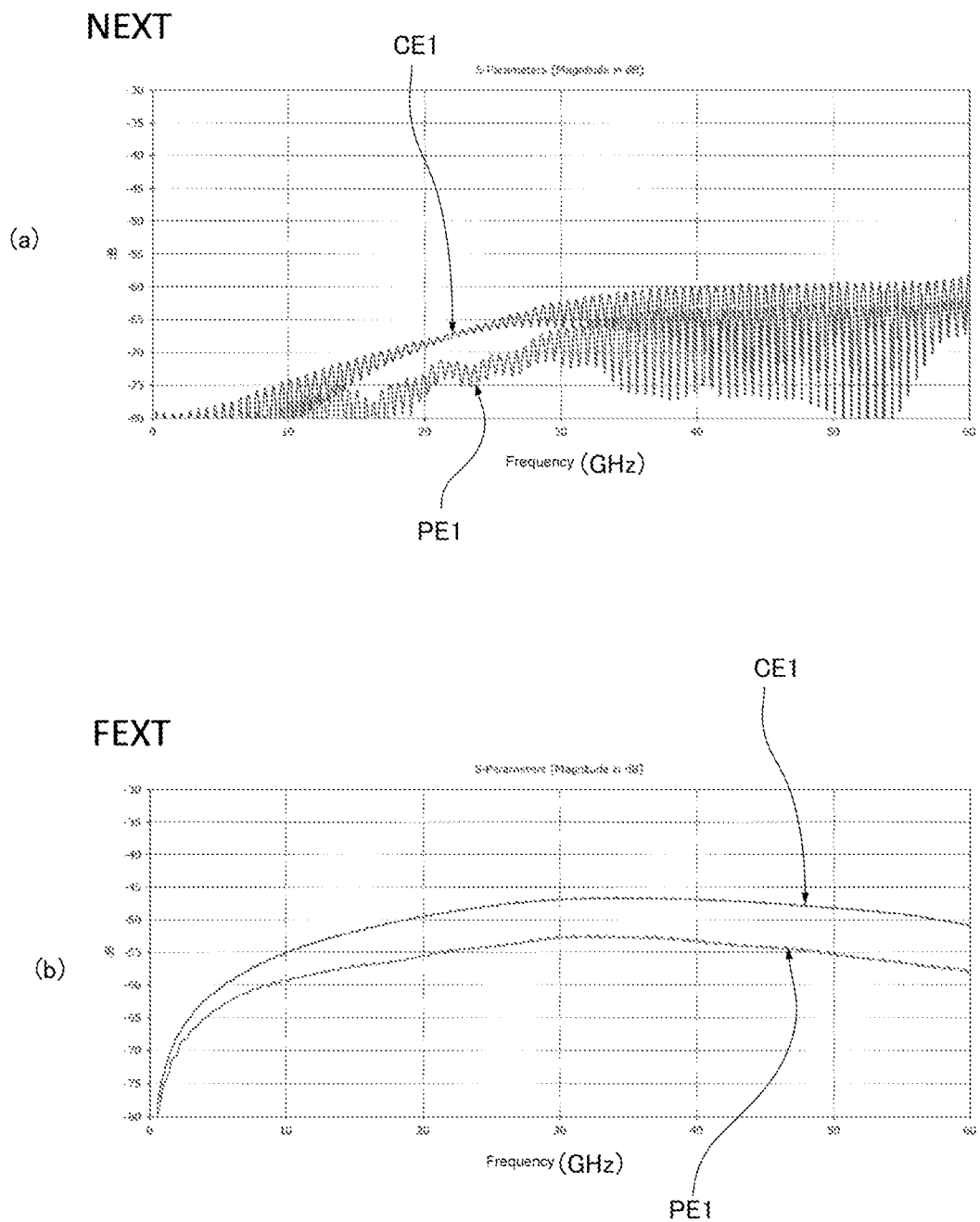

HIGH-FREQUENCY SIGNAL TRANSMISSION DEVICE AND HIGH-FREQUENCY SIGNAL TRANSMISSION CABLE

CROSS-REFERENCE TO RELATED APPLICATIONS

This application is a U.S. national stage application of International Application No. PCT/JP2021/015932, filed Apr. 19, 2021, the contents of which are incorporated by reference.

TECHNICAL FIELD

The present disclosure is directed to high-frequency signal transmission device and high-frequency signal transmission cable.

BACKGROUND ART

Enhanced isolation between differential transmission lines is important in high-frequency signal transmission cables to suppress the crosstalk. Patent literature 1 concerns a flexible wiring cable with coplanar first ground patterns arranged to sandwich high-speed transmission lines, and these first ground patterns are connected via interlayer-wirings to first and second ground layers of upper and lower layers. This arrangement allows reduction of crosstalk and electromagnetic noise, allowing facilitated impedance matching owing to stabilized ground potential (para. 0044 of the same literature).

Patent literature 2 discloses a dielectric substrate having a top surface on which differential transmission lines are arranged and further coplanar conductor layers are arranged to sandwich the respective differential transmission line; a bottom conductor layer provided on a bottom surface of the dielectric substrate approximately entirely, and the coplanar conductor layers and bottom conductor layer electrically connected via interlayer-conductors; and moreover interspace between the interlayer-conductors and thickness of the dielectric substrate set to be equal to or less than ¼ of wavelength of high-frequency signal transmitted through the differential transmission line.

Patent literature 3 discloses that signal conductor patterns are provided between upper ground conductor patterns and lower ground conductor patterns, and a vacant hole is formed between the signal conductor patterns running in parallel one another.

CITATION LIST

Patent Literature

[PTL 1] Japanese Patent Application Laid-open No. 2007-234500
[PTL 2] Japanese Patent Application Laid-open No. 2003-224408
[PTL 3] Japanese Patent Application Laid-open No. 2016-92561

SUMMARY

Technical Problem

Patent literature 1 discloses a conventional configuration where ground lines are respectively interposed between the differential transmission lines in a common plane, and a ground layer (so-called GND plane) is opposed to the differential transmission lines with dielectric layer interposed. Customarily or for a purpose of easier patterning, a ground line has been shared by adjacent differential transmission lines, or a GND plane has been shared by the entirety of differential transmission lines. The present inventors have reviewed such a conventional structure and have newly identified a significance to provide a technology adapted for further progress of higher frequency of transmission signal.

Solution to Problem

High-frequency signal transmission cable according to an aspect of the present disclosure includes: a dielectric layer; and first and second wiring layers arranged to sandwich the dielectric layer, the first wiring layer including at least M (M indicating a natural number of 2 or more) differential transmission lines. The first wiring layer further includes a group of first ground lines including at least 2×M first ground lines, and the second wiring layer includes a group of second ground lines including at least M second ground lines. The group of first ground lines are allocated to the M differential transmission lines in accordance with a condition of at least two first ground lines per one differential transmission line in non-overlap manner, and the group of second ground lines are allocated to the M differential transmission lines in accordance with a condition of at least one second ground line per one differential transmission line in non-overlap manner. Each of the differential transmission lines is interposed between the at least two first ground lines and is opposed to the at least one second ground line.

At least two first ground lines arranged to sandwich a given differential transmission line may be electrically coupled, via an interlayer-wiring, to the second ground line that is opposed to the given differential line.

A high-frequency signal transmission device according to another aspect of the present disclosure includes a high-frequency signal transmission cable of any one of the above disclosed ones; and a connector to which the high-frequency signal transmission cable is electrically coupled at its one end, the connector including: an insulator; and a plurality of contact terminals arranged in a width direction of the insulator and supported by the insulator.

In some embodiments, in the connector, the plurality of contact terminals includes at least M pairs of signal contact terminals and at least 2×M ground contact terminals, the at least 2×M ground contact terminals are allocated to the at least M pairs of signal contact terminals in accordance with a condition of at least two ground contact terminals per one pair of signal contact terminals in non-overlap manner, and each of the pairs of signal contact terminals is interposed between the at least two ground contact terminals.

The high-frequency signal transmission device may comprise a first connector electrically coupled to a first end of the high-frequency signal transmission cable, and a second connector electrically coupled to a second end thereof. The respective connectors may be ones of identical structure. Plug member may be attached to one end of the high-frequency signal transmission cable so as to assist assembling of the high-frequency signal transmission cable and the connector. Contact pads of signal lines of the differential transmission lines and contact pads of the first ground lines may be arranged between the bosses of the plug member.

The insulator of the connector may comprise holes to which the bosses are respectively inserted.

Advantageous Effects of Invention

According to an aspect of the present disclosure, a technology is provided which may be adapted for further progress of higher frequency of transmission signal.

BRIEF DESCRIPTION OF DRAWINGS

FIG. 1 is a schematic perspective view of a high-frequency signal transmission device according to an aspect of the present disclosure.

FIG. 2 is a schematic bottom view of a cable device.

FIG. 3 is a diagram illustrating a schematic and partial cross-section of FPC.

FIG. 4 is a schematic and partial bottom view illustrating an end of FPC.

FIG. 5 is a schematic perspective view of connector illustrating its front side.

FIG. 6 is a schematic perspective view of connector illustrating its rear side.

FIG. 7 is a schematic exploded perspective view of the connector, mainly illustrating that 8 attachment members and 9 metal fixing members are separated rearward from an insulator body.

FIG. 8 is a diagram illustrating that 4 contact terminals in GSSG array are respectively received by 4 receiving grooves formed on a bottom plate of the insulator body.

FIG. 9 is a diagram illustrating a schematic cross-section taken along an alternate long and short dash line X9-X9 in FIG. 8.

FIG. 10 is a schematic exploded perspective view of attachment member, illustrating a state where an electroconductive part is detached from the attachment member.

FIG. 11 is a schematic top view of attachment member.

FIG. 12 is a schematic cross-sectional view taken along an alternate long and short dash line X12-X12 in FIG. 11.

FIG. 13 is a schematic partial rear view of connector.

FIG. 14 is a diagram illustrating a state where the FPC is inserted into the connector and the both are electrically coupled.

FIG. 15 is a schematic partial top view of FPC according to another embodiment.

FIG. 16 is a diagram illustrating a schematic cross-section taken along an alternate long and short dash line X16-X16 in FIG. 15.

FIG. 17 is a diagram illustrating a state of interconnection between the contact terminals of the connector and the contact pads of the signal lines.

FIG. 18 is a diagram showing a result of simulation.

FIG. 19 is a diagram showing a result of simulation.

FIG. 20 is a diagram showing a result of simulation.

DESCRIPTION OF EMBODIMENTS

Hereinafter, non-limiting embodiments and features of the present invention would be discussed with reference to FIGS. 1-20. A skilled person would be able to combine respective embodiments and/or respective features without requiring excess description, and would appreciate synergistic effects of such combinations. Overlapping descriptions among the embodiments are basically omitted. Referenced drawings aim mainly for describing inventions and are simplified for the sake of convenience of illustration. The respective features should be appreciated as universal features not only effective to high-frequency signal transmission cables presently disclosed but also effective to other various high-frequency signal transmission cables not disclosed in the present specification. In the present specification, languages such as first and second are used for differentiating same parts such as connectors in necessary situations but, the same parts can be differentiated alternatively or additionally in light of languages of relative positional relation or direction (front, rear, left, right, upper and lower).

High-frequency signal transmission device 9 has a (first) connector 1, a (second) connector 2, and a cable device 3. The connectors 1,2 are ones of identical structure, and thus will be described without distinguishing them. In other words, descriptions on one connector would be applicable for the other one as it is, and vice versa. Detail descriptions on the configuration of the connector 1,2 would follow below.

The cable device 3 has a FPC (Flexible Printed Circuits) 4, a (first) plug member 5 attached to an end 41 of the FPC 4 to assist assembling of the FPC 4 and the connector 1, and a (second) plug member 6 attached to an end 42 of the FPC 4 to assist assembling of the FPC 4 and the connector 2. Note that, the FPC 4 is a non-limiting example of high-frequency signal transmission cable. The FPC may be referred alternatively to a flat cable.

The connectors 1,2 each is mechanically connected to the plug member 5,6 and electrically coupled to the FPC 4 (particularly to a group of contact pads arranged in respective end of the FPC 4). The plug member 5,6 are ones of identical structure and thus will be described without distinguishing them. The connector 1,2 may be referred to a receptacle connectors in relation to the FPC 4 and/or the plug member 5,6. Note that the plug members 5,6 are optional parts and can be omitted.

FPC 4 is a laminate of a dielectric layer 70, a (first) wiring layer 71, a (second) wiring layer 72, a cover layer 73 covering the wiring layer 71 and a cover layer 74 covering the wiring layer 72 (See FIG. 3). The FPC 4 is a cable with a flexibility sufficient for U-like bending, but a cable with no flexibility may be employed. The dielectric layer 70 may be a resin sheet having a given relative dielectric constant such as LCP (Liquid crystal polymer) and polyimide. Similarly, the cover layer 73,74 may be a resin film such as of LCP (Liquid crystal polymer) and polyimide. The cover layer is removed in the ends 41,42 of the FPC 4, resulting in fluctuation of stray capacitance between a signal line 85 and a first ground line 81 described below compared with a section covered by the cover layer. Wirings included in the wiring layer 71,72 may be metal foils such as copper foils.

At least M (M indicating a natural number of 2 or more) differential transmission lines 8 and at least 2×M first ground lines 81 (referred to as a group of first ground lines) are formed in the wiring layer 71. Signal lines 85 of differential transmission lines 8 and the first ground lines 81 are arranged in coplanar relation. At least M second ground lines 82 (referred to as a group of second ground lines) are formed in the wiring layer 72. Typically, number of the second ground lines 83 included in the group of second ground lines is half of number of the first ground lines 81 included in the group of first ground lines, but should not necessarily be limited to this. Note that, in the illustrated case, M=8 but should not be limited to this.

As a feature of the present disclosure, the group of first ground lines are allocated to the M differential transmission lines 8 in accordance with a condition of at least two first ground lines per one differential transmission line 8 in non-overlap manner, and the group of second ground lines are allocated to the M differential transmission lines 8 in accordance with a condition of at least one second ground line per one differential transmission line 8 in non-overlap manner. As a result of this, each of the differential transmission lines 8 is interposed between the (allocated) at least two first ground lines 81 (more particularly in a coplanar relation) and is opposed to the (allocated) at least one second ground line 82 (more particularly with the dielectric layer 70 interposed) (See FIG. 3). Such a configuration allows reduction of crosstalk otherwise caused when a ground line or GND plane is shared by the differential transmission lines. Note that in instances where the ground line or GND plane is shared by the differential transmission lines, there is a possibility that signal leaks from one differential transmission line to the other differential transmission line via the ground line or GND plane (e.g. common mode noise (or electrical current) transmitted from an apparatus to the ground line), and this may not be sufficiently avoided despite of employment of differential transmission system.

In some cases, one signal transmission channel is configured from (at least) total five wirings including four wirings in a first plane (i.e. two signal lines 85 of the differential transmission line 8 and two first ground lines 81) and one wiring in a second plane (i.e. one second ground line 82). Number of signal transmission channel may also be denoted by M. Advantageously, no ground line is shared by adjacent signal transmission channels on the FPC 4 (e.g. in the entire length of the FPC 4).

In the respective signal transmission channels, it would be preferred to electrically couple the respective first ground lines 81 to the common second ground line 82 via plural interlayer-wirings 86 so as to stabilize the potential of the first ground lines 81 and the second ground line 82 (See FIG. 4). Note that the first ground lines 81 are narrower in width than the second ground line 82. Furthermore in one signal transmission channel, the interlayer-wirings 86 for coupling one of the first ground lines 81 to the second ground line 82 and the interlayer-wirings 86 for coupling the other one of the first ground lines 81 to the second ground line 82 may preferably be same in number and may be arranged at a same pitch, but should not be limited to this. Plural individual third ground lines (not illustrated) may be formed on the cover layer 73 in a similar fashion as the second ground lines 82.

The signal line 85 may be shaped such that an exposed portion thereof not covered by the cover layer 73 has a narrower width than a portion thereof covered by the cover layer 73 (See widths W1 and W2 in FIG. 4). For example, contact pads 85a at both ends of the signal line 85 are shaped to have a narrower width than an intermediate line 85b extending between these contact pads 85a. This allows absorbing of fluctuation in relative dielectric constant between the cover layer 73 and the air so that uniform signal transmission performance would be maintained. The contact pad 85a is formed to be narrower in width and thus the alignment accuracy required for electrical coupling between the FPC 4 and the connector 1,2 would be increased, but this may be avoided by employment of the plug member(s).

The first ground line 81 may be shaped such that an exposed portion thereof not covered by the cover layer 73 has a wider width than a portion thereof covered by the cover layer 73 (See widths W3 and W4 in FIG. 4). For example, contact pads 81a at both ends of the first ground line 81 are shaped to have a wider width than an intermediate line 81b extending between these contact pads, and an interspace between the contact pad 81a of the first ground line 81 and the contact pad 85a of the signal line 85 is narrowed in accordance with the wider width of the contact pad 81a. This allows absorbing of fluctuation in relative dielectric constant between the cover layer 73 and the air so that uniform signal transmission performance would be maintained. Even though the contact pad 81a is widened in width, a higher alignment accuracy for electrical coupling between the FPC 4 and the connectors 1,2 would be still required as the contact pad 85a is narrowed in width. Note that the width of the contact pad 85a of the signal line 85 may be equal to or less than ⅔ or ½ of the width of the contact pad 81a of the first ground line 81.

The contact pad 85a of the signal line 85 may be located offset away from the end of the FPC 4 than the contact pad 81a of the first ground line 81. Accordingly, when a contact portion of the contact terminal 12 of the connector 1 and the contact pad 85a of the signal line 85 are in contact, a length of open stab extending to the end of the signal line 85 from the contact position therebetween would be shorter.

Now we refer back to FIG. 1 for further discussion. The plug members 5,6 are attached to the ends 41,42 of the FPC 4. The plug member 5 has a plug body 51, a pair of bosses 52 arranged at both edges of the plug body 51 in its width direction, and a locked portion 53 located between the pair of bosses 52 in the width direction of the plug body 51. The plug body 51 is a frame with a space through which the inserted FPC 4 passes. Accordingly, as the FPC 4 is inserted into the plug member 5, the contact pads of the FPC 4 (i.e. the contact pads 81a of the first ground lines 81 and the contact pads 85a of the signal lines 85) are arranged between the pair of bosses 52, extending forward from the plug body 51, along the width direction of the FPC 4.

In more detail, plural unit arrays of contact pads are arranged in the width direction of the FPC 4, wherein in each unit array a pair of the contact pads 85a (of the signal lines 85) is interposed between paired contact pads 81a (of the first ground lines 81). In each unit array, the contact pad 85a is positioned farther from the end of the FPC 4 than the contact pad 81a. Descriptions on the plug member 5 would be applicable for the plug member 6 and descriptions thereof would be omitted (reference numbers 5,51-53 should be replaced with reference numbers 6,65-67).

As illustrated in FIGS. 5 to 7, the connector 1 has an insulator 11 and plural contact terminals 12 arranged in the width direction of the insulator 11 and supported by the insulator. The insulator 11 is made of any insulating resin, and is shaped as a receptacle to support the contact terminals 12 and to receive the FPC 4. The insulator 11 has an insulator body 21 and at least M attachment members 22 attached to the insulator body 21 and arranged in the width direction of the insulator 11. Optionally, M+1 metal fixing members 23 may be provided for securing the attachment members 22 to the insulator body 21. Furthermore, two metal fixing members 24 are provided for fixing the insulator 11 onto a mounting board (e.g. motherboard or daughterboard) on which the connector 1 is mounted. Note that the width direction of the connector 1/the insulator 11 is identical to the width direction of the FPC 4 and similarly identical to the arrangement direction of the contact terminals 12 and the arrangement direction of the attachment members 22.

Plural contact terminals 12 include at least M (M indicating a natural number of 2 or more) pairs of signal contact terminals 12S and at least 2×M ground contact terminals 12G. Furthermore, at least 2×M ground contact terminals 12G are allocated to at least M pairs of signal contact terminals 12S in accordance with a condition of at least two ground contact terminals 12G per one pair of signal contact terminals 12S in non-overlap manner, and each of the pairs of signal contact terminals 12S is interposed between the at least two ground contact terminals 12G. That is, M (M indicating a natural number of 2 or more) unit arrays C1-C8 may be arranged in the width direction of the insulator 11, wherein in each unit array the pair of signal contact terminals 12S is interposed between the paired ground contact terminals 12G. No ground contact terminal is shared by adjacent signal contact terminals 12S which are adjacent in the width direction of the connector 1, facilitating the reduction of signal crosstalk.

Each of the attachment members 22 may be configured to support 4 contact terminals 12 in which a pair of signal contact terminals 12S is interposed between two ground contact terminals 12G. The M attachment members 22 are attached to the insulator body 21 to deploy the contact terminals 12 in the insulator 11. The signal transmission channels each configured from the combination of the 4 contact terminals 12 are supported by separate attachment members 22, enhancing electrical isolation between the signal transmission channels and facilitating the reduction of crosstalk. Note that, regarding the number of the attachment members 22, it should not be limited to M=8 but it may be a natural number of M=2 or more.

The insulator body 21 is a frame having a front mouth 21a at the side of the FPC 4 (see FIG. 5) and a rear mouth 21b at the opposite side of the FPC 4 (See FIG. 7), and has a top plate 25, a bottom plate 26, a left wall 27 and a right wall 28. Note that the front side indicates a direction directed toward the FPC 4 from the connector 1 and based on this direction, the left and right sides are also defined.

A recess 31 is formed at a top surface of the top plate 25, and a locking portion 33 is provided onto a bottom surface of the recess 31. A through-hole 32 is formed at a position adjacent to the left wall 27 and penetrates the insulator body 21 in the front-rear direction. Similarly, a through-hole 32 is formed at a position adjacent to the right wall 28 and penetrates the insulator body 21 in the front-rear direction. The bosses 52 of the plug member 5 are respectively inserted in to the through-holes 32, facilitating improved alignment of the FPC 4 relative to the connector 1. Note that the through-holes 32 are in spatial communication with the front mouth 21a of the insulator body 21, preventing the insulator 11 from being wider in width.

As the FPC 4 is fully inserted in the connector 1 to a given position, the locked portion 53 of the plug member 5 is locked by the locking portion 33 of the insulator body 21. Specific locking mechanism of the locking portion 33 and the locked portion 53 would be variously modified by a skilled person in the art. For example, the locked portion 53 may be a pivotable pawl that slides across a guide slope 33m (that is sloped upward toward the rear side) of the locking portion 33 as the FPC 4 is inserted into the connector 1, and then be in contact with a locking face 33n that extends downward from a top edge of the guide slope 33m.

In the bottom plate 26, the receiving grooves 26g are arranged in parallel, particularly units of given number (four) of receiving groove 26g are arranged in the width direction of the insulator body 21. Each receiving groove 26g extends in the front-rear direction so as to receive the contact terminal 12 supported by the attachment member 22. For example, each receiving groove 26g is defined by left and right wall surfaces extending in the front-rear direction and a bottom surface extending in the front-rear direction, and is open at the top, front and rear sides. The contact terminal 12 may be inserted into the receiving groove 26g via the opening of the receiving groove 26g at the top side. Depending on a shape of the contact terminal 12, it may be inserted via the rear opening of the receiving groove 26g. Pitch interval I1 between the receiving grooves 26g in a same unit is lesser than an interspace I2 between the units, and is equal to or less than ½ of the interspace I2. The number of the receiving grooves 26g included in the unit is equal to the number of contact terminals 12 supported by one attachment member 22.

Each contact terminal 12 has an arm 61 that extends in a cantilever fashion forward from the attachment member 22, a securement portion 62 secured to the attachment member 22 and a contact portion 63 that extends rearward from the attachment member 22 (See FIGS. 7 and 8). The arm 61 includes an arm plate 61a, and an arm bar 61b located farther from the attachment member 22 than the arm plate 61a and has a narrower width than the arm plate 61a. The arm plate 61a has a width in the left-right direction that gradually decreases as extending forward. The arm bar 61b extends forward farther from a front end of the arm plate 61a. The arm bar 61b extends forward obliquely and then extends downward obliquely so as to have a curved contact portion 61c that will contact the contact pad of the FPC 4. The arm bar 61b is employed and higher accuracy would be required for alignment relative to the contact pad of FPC 4, but this burden would be reduced by employing the plug member.

A portion of the contact terminal 12 between the contact portion 61c and the front end 61d of the arm bar 61b functions as an open stub, and is not necessary from a viewpoint of signal transmission. However, this is provided for a purpose of preventing the contact terminal 12 from buckling due to collision with the FPC 4. The contact portions 61c of the contact terminals 12 supported by a common attachment member 22 are arranged on a line L1 that is parallel to the width direction of the insulator 11, but should not necessarily be limited to this. The attachment members 22 may be appropriately attached to the insulator body 21 so that all of the contact portions 61c of the contact terminals 12 provided in the insulator 11 are arranged on the line L1.

As the attachment member 22 is attached to the insulator body 21, the arms 61 of the contact terminals 12 of the attachment member 22 are respectively inserted into the receiving grooves 26g (See FIG. 9). This allows that a resin having a relative dielectric constant greater than one of the air e.g. PBT (Polybutylene terephthalate) or LCP (Liquid crystal polymer) or the like is interposed between the adjacent contact terminals 12, making it possible to regulate the stray capacitance between the adjacent contact terminals 12, resulting in better impedance-matching with the FPC 4. The contact terminal 12 is slightly curved out upward from the receiving groove 26g at the curved contact portion 61c, ensuring electrical coupling between the contact terminal 12 and the FPC 4.

The receiving groove 26g is shaped to be deeper at the side of a terminal end (front end) of the arm 61. In particular, the receiving groove 26g has a groove rear portion 26g1 that receives the arm plate 61a of the contact terminal 12 and a groove front portion 26g2 that receives an open stub of the contact terminal 12, and the depth of the groove front portion 26g2 is greater than the depth of the groove rear portion 26g1. Accordingly, the receiving groove 26g can receive the entirety of the arm 61 except for the curved-out portion of the contact portion 61c.

The width of the receiving groove 26g may be set corresponding to (i.e. in synchronization with) the width change of the arm 61. That is, the receiving groove 26g has a first groove width for receiving the arm plate 61a and a second groove width for receiving the arm bar 61b which is narrower than the first groove width. Additionally or alternatively, the receiving groove 26g has a minimum groove width at a position corresponding to the contact portion 61c. This allows increased amount of resin interposed between the contact terminals 12.

Note that the arm 61 is pushed downward due to contact with the FPC 4, and the front end 61d of the arm 61 may touch the bottom surface of the receiving groove 26g. In this situation, the FPC 4 and the contact terminal 12 are brought into a mutually pushing relationship, and the both would be more surely electrically coupled.

The securement portion 62 of the contact terminal 12 includes an exposed portion 62c that is exposed in an insertion hole 34 of the attachment member 22. The remainder 62a,62b of the securement portion 62 are embedded in the resin of the attachment member 22. The contact portion 63 extends rearward from the attachment member 22 but, various modifications would be possible with respect to its length, thickness and manner of bending and number of bending.

The attachment member 22 is a member with the insertion hole 34 to which an electroconductive part 13 is inserted (See FIGS. 10-12). The attachment member 22 is a tubular body having a front wall 35, rear wall 36, left wall 37, and right wall 38 which define the insertion hole 34 into which the electroconductive part 13 may be pressed. Note that the insertion hole 34 is open at both top and bottom sides. The right wall 38 has a recess 39 that extends front-rear direction and is open at the right side. Similarly, the left wall 37 has a recess 39 that extends front-rear direction and is open at the left side.

The electroconductive part 13 may be a member in which conductive fillers are dispersed in an insulating resin. The electroconductive part 13 has a main body 13j and at least two legs 13p that protrude downward from the main body 13j. The main body 13j is a tapered member with a width W4 in the front-rear direction that decreases as extending downward. The legs 13p are solids that respectively protrude downward from the left and right edges of the main body 13j, and respectively touch, at its bottom surfaces, top surfaces of the exposed portions 62c of the ground contact terminals 12G. Note that the (maximum) width W3 of the electroconductive part 13 in the left-right direction is equal to or slightly greater or lesser than the interspace between the left wall 37 and the right wall 38 of the attachment member 22. Similarly, the (maximum) width W4 of the electroconductive part 13 in the front-rear direction is equal to or slightly greater or lesser than the interspace between the front wall 35 and the rear wall 36 of the attachment member 22. The width W5 of the electroconductive part 13 in the up-down direction changes in accordance with the existence and non-existence of the leg 13p.

As the electroconductive part 13 is inserted into the insertion hole 34 of the attachment member 22, the respective legs 13p of the electroconductive part 13 touch the exposed portions 62c of the ground contact terminals 12G located in the insertion hole 34. A space 13q is formed between the legs 13p and thus electrical coupling between the electroconductive part 13 and the signal contact terminals 12S is avoided.

The securement (e.g. embedding) of the contact terminals 12 on the attachment member 12 would be implemented by utilizing insert molding. Injection molding would be performed so that a resin adheres to the remainders 62a, 62b of the securement portion 62 of the contact terminal 12 and solidifies. The above-noted portions of the contact terminals 12 are located in a cavity defined by stationary mold and movable mold, followed by supply of molten resin into the cavity, and followed by cooling of the molds. The molten resin is solidified in the cavity as such, and the attachment member 22 is produced where the contact terminals 12 are partially embedded. Note that the insertion hole 34 is a space formed corresponding to a core located in the cavity for a purpose of positioning the contact terminals 12 during the injection molding.

As the contact terminals 12 are supported by the attachment member 22, positioning of the attachment members 22 to the insulator body 21 would be required. That is, if positioning accuracy of the attachment member 22 in the insulator body 21 was reduced, positioning accuracy of the contact terminals 12 in the connector 1 would be also reduced. From such a viewpoint, metal fixing members 23 may be utilized for positioning the attachment members 22 in the insulator body 21 in some cases.

The metal fixing member 23 has an insertion portion 23a, a wing 23b protruding to the both left and right sides, and a bending portion 23c (See FIG. 7). When the attachment members 22 are placed adjacent in the width direction of the insulator 11, the recesses 39 of the adjacent attachment members 22 are combined to form an insertion slot 22k for the metal fixing member 23 (See FIG. 13). The insertion portion 23a of the metal fixing member 23 is inserted (preferably pressed) into the insertion slot 22k, thus preventing the attachment members 22 from displacing in the insulator body 21. The wing 23b of the metal fixing member 23 collides the rear faces of the attachment members 22, defining a stop position for the inserted metal fixing member 23 and resulting in a situation where the attachment members 22 are pushed by the wing 23b from the rear side. The bending portion 23c may be soldered to a mounting substrate for the connector 1 through reflow process. The metal fixing members 23 may be coupled to a ground potential on the mounting substrate on which the connector 1 is mounted. This allows increased isolation between the signal transmission channels of the connector 1. In some cases, the insertion portion 23a of the metal fixing member 23 is inserted into a groove formed in the insulator body 21, thus effectively restricting displacement of the metal fixing member 23.

When assembling the plug member 5 and the connector 1 for a purpose of electrically coupling the FPC 4 to the connector 1, the boss 52 and the through-hole 32 are fitted, guiding the FPC 4 to be suitably inserted into the connector 1. After the FPC 4 is inserted into the insulator 11 via the front mouth 21a of the insulator 11, the FPC 4 is place on the bottom plate 26 of the insulator body 21. The contact portions 61c of the contact terminals 12 are slightly curved out upward from the receiving grooves 26g. Therefore, in accordance with insertion of the FPC 4, the bottom surface of the FPC 4 is brought into contact with the top surfaces of the contact portions 61c, and the contact portions 61c are pushed downward. After the FPC 4 is inserted to a given position, it is ensured that the contact portions 61c of the contact terminals 12 of the connector 1 and the contact pads 81a,85a of the FPC 4 are in contact respectively (See FIG. 14). In more detail, the contact portion 61c of the arm 61 of the signal contact terminal 12S touches the contact pad 85a of the signal line 85. Similarly, the contact portion 61c of the arm 61 of the ground contact terminals 12G touches the contact pad 81a of the first ground line 81.

What should be noted is that in the high-frequency signal transmission device 9 assembled from a combination of the FPC 4 and the connector 1,2, a ground potential is not shared between the respective signal transmission channels. In particular, a ground line is not shared between the differential transmission lines 8 of the FPC 4. A ground contact terminal 12 G is not shared between the pairs of the signal contact terminals 12S of the connector 1,2 to be electrically connected to the differential transmission lines 8. As such, the sharing of ground potential between the differential transmission lines in both of the FPC 4 and the connector 1,2 is avoided so that the electrical isolation is enhanced, and the crosstalk would be expectedly reduced. It would be possible to implement the non-sharing of the ground potential only in the FPC 4 or only in the connector 1,2 instead of in both of the FPC 4 and the connector 1,2.

As illustrated in FIGS. 15-17, the first ground lines 81 and the signal lines 85 may be formed at the top side of the FPC 4, and the contact pads 81*a*,85*a* may be formed at the bottom side of the FPC 4, and these are coupled via respective interlayer-wirings. That is, there is no need to form the contact pads 81*a* of the first ground line 81 and the contact pads 85*a* of the signal lines 85 in the wiring layer 71. Likewise FIG. 3, the second ground lines 82 are formed in the wiring layer 72 which are not illustrated in FIGS. 15-17.

FIG. 18 shows a result of simulation regarding insertion loss for the high-frequency signal transmission device (connectors connected to both ends of the cable device). FIG. 18(*a*) shows a result of a case where first ground lines are shared by adjacent differential transmission lines, and the second ground line is shared by all of the differential transmission lines. FIG. 18(*b*) shows a result of the embodiment according to the present disclosure. As illustrated in FIG. 18, improvement in ripples about wavelength of 30 GHz was achieved in the embodiment according to the present disclosure.

FIG. 19 shows a result of simulation regarding crosstalk characteristic for the high-frequency signal transmission device (connectors connected to both ends of the cable device). FIG. 19(*a*) shows a result of simulation regarding NEXT (Near End Cross Talk) where PE1 is related to the present embodiment and CE1 is related to a comparative example. FIG. 19(*b*) shows a result of simulation regarding FEXT (Far End Cross Talk) where PE1 is related to the present embodiment and CE1 is related to a comparative example. Note that, in both FIGS. 19(*a*) and 19(*b*), the comparative example utilizes a cable device where first ground lines are shared between the adjacent differential transmission lines (i.e. one first ground line is interposed between adjacent differential transmission lines). As shown in FIGS. 19(*a*) and 19(*b*), the PE1 has a crosstalk lesser than that of CE1. It has been confirmed that the reduction of crosstalk is facilitated in the present embodiment.

FIG. 20 shows a result of simulation regarding crosstalk characteristic for the cable device. FIG. 20(*a*) shows a result of simulation regarding NEXT (Near End Cross Talk) where PE1 is related to the present embodiment and CE1 is related to a comparative example. FIG. 20(*b*) shows a result of simulation regarding FEXT (Far End Cross Talk) where PE1 is related to the present embodiment and CE1 is related to a comparative example. Note that, in both FIGS. 20(*a*) and 20(*b*), the comparative example utilizes a cable device where first ground lines are shared between the adjacent differential transmission lines (i.e. one first ground line is interposed between adjacent differential transmission lines). As shown in FIGS. 20(*a*) and 20(*b*), the PE1 has a crosstalk lesser than that of CE1. It has been confirmed that the reduction of crosstalk is facilitated in the present embodiment.

Based on the above teachings and disclosures, a skilled person in the art would be able to add various modifications to the respective embodiments. Shape of the contact terminal should not be limited to the disclosed one, and it would be possible to employ a contact terminal where two or more contact portions are formed in one contact terminal. It would also be possible to arrange the contact terminals so as to be in electrical contact with the contact pads at the both sides of the FPC. In particular, one array of contact terminals is arranged to be in contact with the contact pads at the top side of the FPC, and the other array of the contact terminals is arranged to be in electrical contact with contact pads at the bottom side of the FPC. As such, the FPC should not be limited to one with contact pads on its one side, but it would be possible to employ ones with contact pads at both sides.

REFERENCE CODES

1,2: Connector
4: FPC
5,6: Plug member
8: Differential transmission line
9: High-frequency signal transmission device
11: Insulator
12: Contact terminal (12G: Ground contact terminal, 12S: Signal contact terminal)
13: Electroconductive part
21: Insulator body
22: Attachment member
70: Dielectric layer
71,72: Wiring layer
73,74: Cover layer
81: First ground line
82: Second ground line
85: Signal line

The invention claimed is:

1. A high-frequency signal transmission cable comprising:
a dielectric layer; and
first and second wiring layers arranged to sandwich the dielectric layer, the first wiring layer including at least M (M indicating a natural number of 2 or more) differential transmission lines,
wherein the first wiring layer further includes a group of first ground lines including at least 2×M first ground lines;
the second wiring layer includes a group of second ground lines including at least M second ground lines;
the group of first ground lines are allocated to the M differential transmission lines in accordance with a condition of at least two first ground lines per one differential transmission line in non-overlap manner, and the group of second ground lines are allocated to the M differential transmission lines in accordance with a condition of at least one second ground line per one differential transmission line in non-overlap manner; and
each of the differential transmission lines is interposed between the at least two first ground lines and is opposed to the at least one second ground line.

2. The high-frequency signal transmission cable of claim 1 further comprising:
a first cover layer that covers the first wiring layer,
wherein signal lines of the differential transmission lines each are shaped to have an exposed portion that is not covered by the first cover layer and is narrower in width than a portion thereof covered by the first cover layer.

3. The high-frequency signal transmission cable of claim 1, wherein signal lines of the differential transmission lines each is shaped to have contact pads at its both ends which are narrower in width than an intermediate line thereof extending between the contact pads.

4. The high-frequency signal transmission cable of claim 1 further comprising:
a first cover layer that covers the first wiring layer,
wherein the first ground line is shaped to have an exposed portion that is not covered by the first cover layer and is wider in width than a portion thereof covered by the first cover layer.

5. The high-frequency signal transmission cable of claim 1, wherein the first ground line is shaped to have contact pads at its both ends which are widened in width than an intermediate line thereof extending between the contact pads and in accordance with the widened contact pads, an interspace between the contact pad of the first ground line and a contact pad of a signal line of the differential transmission line is narrowed.

6. The high-frequency signal transmission cable of claim 1, wherein a contact pad of each signal line of the differential transmission line has a width that is equal to or less than $2/3$ or $1/2$ of a width of a contact pad of the first ground line.

7. The high-frequency signal transmission cable of claim 1, wherein contact pads of signal lines of the differential transmission lines are located offset away from an end of the cable than contact pads of the first ground lines.

8. The high-frequency signal transmission cable of claim 1, wherein said M indicates a natural number of 4 or more.

9. A high-frequency signal transmission device comprising:
a high-frequency signal transmission cable of claim 1; and
a connector to which the high-frequency signal transmission cable is electrically coupled at its one end,
the connector comprising:
an insulator; and
a plurality of contact terminals arranged in a width direction of the insulator and supported by the insulator.

10. The high-frequency signal transmission device of claim 9, wherein in the connector,
the plurality of contact terminals includes at least M pairs of signal contact terminals and at least 2×M ground contact terminals,
the at least 2×M ground contact terminals are allocated to the at least M pairs of signal contact terminals in accordance with a condition of at least two ground contact terminals per one pair of signal contact terminals in non-overlap manner, and
each of the pairs of signal contact terminals is interposed between the at least two ground contact terminals.

11. The high-frequency signal transmission device of claim 10, wherein the insulator comprises an insulator body, and at least M attachment members attached to the insulator body and arranged in a width direction of the insulator.

12. The high-frequency signal transmission device of claim 11, wherein the attachment members each is configured to support at least 4 contact terminals in which the pair of signal contact terminals is interposed between the at least two ground contact terminals.

13. The high-frequency signal transmission device of claim 12, wherein the attachment members each retains an electroconductive part via which the at least two ground contact terminals are electrically coupled one another.

14. The high-frequency signal transmission device of claim 13, wherein the attachment members each has an insertion hole to which the electroconductive part is inserted, the electroconductive part has at least two legs each being in contact with a portion of the ground contact terminal located and exposed in the insertion hole of the attachment member.

15. The high-frequency signal transmission device of claim 9, further comprising a plug member attached to one end of the high-frequency signal transmission cable so as to assist assembling of the high-frequency signal transmission cable and the connector.

16. The high-frequency signal transmission device of claim 15, wherein the plug member has at least two bosses, contact pads of signal lines of the differential transmission lines and contact pads of the first ground lines interposed between the bosses.

17. The high-frequency signal transmission device of claim 16, wherein the insulator of the connector has holes into which the bosses of the plug member are respectively inserted.

18. A high-frequency signal transmission cable comprising:
a dielectric layer having first and second surfaces by which a thickness of the dielectric layer is defined;
a first wiring layer formed on the first main surface of the dielectric layer, the first wiring layer including at least M (M indicating a natural number of 2 or more) differential transmission lines and at least 2×M first ground lines; and
a second wiring layer formed on the second main surface of the dielectric layer, the second wiring layer including at least M second ground lines;
wherein the high-frequency signal transmission cable includes at least M signal transmission channels each including one differential transmission line, two first ground lines and one second ground line, said one differential transmission line interposed between said two first ground lines and opposed to said one second ground line, and
at least two first ground lines belonging to adjacent separate signal transmission channels of said at least M signal transmission channels are interposed between two differential transmission lines belonging to said adjacent separate signal transmission channels.

19. The high-frequency signal transmission device of claim 18, wherein said at least M signal transmission channels are configured to be set to separate ground potential levels on the high-frequency signal transmission device.

20. The high-frequency signal transmission device of claim 18, wherein each signal transmission channel further includes a first set of interlayer-wirings that electrically couple one of said two first ground lines to said one second ground line, and a second set of interlayer-wirings that electrically couple the other one of said two first ground lines to said one second ground line.

* * * * *